US006271592B1

(12) United States Patent
Kim et al.

(10) Patent No.: US 6,271,592 B1
(45) Date of Patent: Aug. 7, 2001

(54) SPUTTER DEPOSITED BARRIER LAYERS

(75) Inventors: Edwin Kim, Santa Clara; Michael Nam, San Jose; Chris Cha, Sunnyvale; Gongda Yao, Fremont; Sophia Lee, Fremont; Fernand Dorleans, San Francisco; Gene Y. Kohara, Fremont; Jianming Fu, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/370,088

(22) Filed: Aug. 6, 1999

Related U.S. Application Data (62) Division of application No. 09/028,946, filed on Feb. 24, 1998, now Pat. No. 5,985,759.

(51) Int. Cl.[7] .................................................. H01L 23/48
(52) U.S. Cl. ..................... 257/751; 257/753; 257/763; 257/764
(58) Field of Search .................................. 257/751, 753, 257/754, 761, 763, 764

(56) References Cited

U.S. PATENT DOCUMENTS

| 4,892,844 | 1/1990 | Cheung et al. .................. 437/194 |
| 4,966,865 | 10/1990 | Welch et al. .................... 437/192 |
| 5,186,718 | 2/1993 | Tepman et al. .................. 29/25.01 |

(List continued on next page.)

FOREIGN PATENT DOCUMENTS

| 0 680 077 | 11/1995 | (EP) | .................. H01L/21/285 |
| 0 720 214 | 7/1996 | (EP) | .................. H01L/21/321 |
| 0 791 663 | 8/1997 | (EP) | .................. C23C/14/06 |
| 0 799 903 | 10/1997 | (EP) | .................. C23C/14/14 |

OTHER PUBLICATIONS

A. Bittar et al., "Study of $TiO_xN_y$ thin film selective surfaces produced by ion assisted deposition ", J. Vac. Sci. Technol. A, vol. 15, No. 2, pp. 223–229 (Mar/Apr 1997).

(List continued on next page.)

*Primary Examiner*—T. N. Quach
(74) *Attorney, Agent, or Firm*—Shirley L. Church, Esq.; Kathi Bean (57) ABSTRACT

The present disclosure pertains to our discovery that depositing various film layers in a particular order using a combination of Ion Metal Plasma (IMP) and traditional sputter deposition techniques with specific process conditions results in a barrier layer structure which provides excellent barrier properties and allows for metal/conductor filling of contact sizes down to 0.25 micron and smaller without junction spiking. Specifically, the film layers are deposited on a substrate in the following order: (a) a first layer of a barrier metal (M), deposited by IMP sputter deposition; (b) a second layer of an oxygen-stuffed barrier metal (MOx), an oxygen-stuffed nitride of a barrier metal (MNOx), or a combination thereof; (c) a third layer of a nitride of a barrier metal ($MN_x$), deposited by IMP sputter deposition of the barrier metal in the presence of nitrogen; and (d) a fourth, wetting layer of a barrier metal, deposited by traditional sputter deposition. The first layer of barrier metal can optionally be annealed to form a silicide of the barrier metal ($MSi_2$) in order to reduce contact resistance and interdiffusion of the silicon and metal/conductor which may result form overetching of contacts. An additional layer of barrier metal can optionally be deposited between the second oxygen-stuffed layer and the third barrier metal nitride layer in order to further improve the barrier properties of the barrier layer structure and to provide for better metal/conductor fill. A thin layer of metal/conductor may be deposited on the walls of the contact via by "long throw" sputter deposition prior to filling the via with metal/conductor in order to provide more uniform fill. The optimum process conditions for sputter deposition of the barrier layer structure of the invention are disclosed herein.

14 Claims, 6 Drawing Sheets

U.S. PATENT DOCUMENTS

| | | | |
|---|---|---|---|
| 5,236,868 | 8/1993 | Nulman | 437/190 |
| 5,317,187 * | 5/1994 | Hindman et al. | 257/659 |
| 5,320,728 | 6/1994 | Tepman | 204/192 |
| 5,449,954 * | 9/1995 | Ito | 257/751 |
| 5,460,693 | 10/1995 | Moslehi | 156/662.1 |
| 5,514,908 | 5/1996 | Liao et al. | 257/751 |
| 5,712,193 | 1/1998 | Hower et al. . | |
| 5,719,446 * | 2/1998 | Taguchi et al. | 257/751 |
| 5,882,399 | 3/1999 | Ngan et al. | 438/648 |
| 5,895,266 | 4/1999 | Fu et al. | 438/648 |
| 5,913,145 | 6/1999 | Lu et al. | 438/643 |
| 6,054,768 * | 4/2000 | Givens et al. | 257/753 |

OTHER PUBLICATIONS

J. S. Byun et al., "Formation of a large grain sized TiN layer using $TiN_x$, the epitaxial continuity at the Al/TiN interface, and its electromigration endurance in multilayered interconnection ", J. Appl. Phys., vol. 78, No. 3, pp. 1719–1724 (Aug. 1995).

C. Chen et al., "Ti/TiN Barrier Improvement for VLSI Metallization ", Mat. Res. Soc. Symp. Proc., vol. 410, pp. 31–36 (1996).

J. Fu et al., "In–situ Coherent TiN Barrier for Al Planarization ", Proc. $13^{th}$ International VLSI Multilevel Interconnection Conference (VMIC), pp. 584–589 (1996).

G. Gagnon et al., "Efficiency of TiN diffusion barrier between Al and Si prepared by reactive evaporation and rapid thermal annealing ", J. Appl. Phys., vol. 79, No. 10, pp. 7612–7620 (May 1996

G. Gagnon et al., "Effect of the oxidation of TiN on the stability of the Al/TiN interface ", J. Appl. Phys., vol. 79, No. 10, pp. 7612–7620 (May 1996).

G. I. Grigorov, "Quantitative Estimate of Si, Al and Fe Diffusion Titanium Nitride Barrier Layers ", Bulgarian Journal of Physics, vol. 22, Nos. 1/2, pp. 69–75 (1995).

D. Jawarani et al., "Intermetallic Compound Formation in Ti/Al Alloy Thin Film Couples and Its Role in Electromigration Lifetime ", J. Electrochem. Soc., vol. 141, No. 1, pp. 302–306 (Jan. 1994).

Y. H. Ku et al., "Stable, self–aligned $TiN_x$ $O_y$ /$TiSi_2$ contact formation for submicron device applications ", Applied Physics Letters, vol. 50, No. 22, pp. 1598–1600 (Jun. 1987).

M. J. Mindel et al., "The Oxidation of Titanium Films ", pp. 189–197.

K. Park et al., "A Comparative Study on the Titanium Nitride (TiN) As a Diffusion Barrier Al/Si and Cu/Si: Failure Mechanism and Effect of 'Stuffing '", Mat. Res. Soc. Symp. Proc., vol. 391, pp. 211–216 (1996).

Park et al., "The effect of density and microstructure on the performance of TiN barrier films in Cu metallization ", J. Appl. Phys., vol. 80, No. 10, pp. 5674–5681 (Nov. 1996).

S. M. Rossnagel and J. Hopwood, "Metal ion deposition from ionized magnetron sputtering discharge ", J. Vac. Sci. Technol. B, vol. 12, No 1, pp. 449–453 (Jan/Feb 1994).

S. M. Rossnagel et al., "Thin, high atomic weight refractory film deposition for diffusion barrier, adhesion layer, and seed layer applications ", J. Vac. Sci. Technol. B, vol. 14, No. 3, pp. 1819–1827 (May/Jun 1996).

Y. Tanaka, "TiN Microstructure Control by IMP Source ", Proc $14^{th}$ International VLSI Multilevel Interconnection Conference (VMIC), pp. 437–439 (1997).

U. S. Patent Application, Serial No. 08/511,825 of Xu et al., filed Aug. 7, 1995.

U. S. Patent Application Serial No. 09/003,014, of Ngan et al., filed Jan. 5, 1998.

PCT Search Report form PCT/US99/03679 (application corresponding to the parent of this application.

* cited by examiner

SPUTTER DEPOSITED BARRIER LAYERS

This application is a divisional application of application Ser. No. 09/028,946, filed Feb. 24, 1998, now U.S. Pat. No. 5,985,759.

BACKGROUND OF THE INVENTION

1. Field of the Invention

The present invention pertains to a barrier layer structure deposited on a semiconductor substrate, wherein the barrier layer structure comprises oxygen to improve the performance of the barrier layer, and to the method used to deposit this barrier layer structure on the substrate.

2. Brief Description of the Background Art

As is well-known in the semiconductor device art, conventional integrated circuit processing steps can cause silicon atoms to diffuse from single-crystal silicon into a metal electrode of pure aluminum to such a depth as to short out a shallow p-n junction in the silicon; this phenomenon is known as junction spiking. Variance occurs during the etching of contacts, and when a contact is over-etched, an increase in spiking is observed. Over-etching provides more area for silicon and aluminum interdiffusion to occur at the bottom of a contact.

To elevate the contact bottom and thus prevent the interdiffusion of adjacent layers of aluminum and silicon and the resultant junction spiking at the bottom of a contact, barrier layers were introduced between the silicon and the overlying aluminum layer prior to aluminum filling and planarization. The most commonly used barrier layer for aluminum contacts is titanium nitride. The titanium nitride may be used alone or in combination with titanium, which may be used to decrease the resistance of the contact. Titanium nitride and titanium layers are typically deposited at the bottom and on the sidewalls of a contact via using physical vapor deposition (PVD). PVD techniques are well-known in the art.

Ion Metal Plasma (IMP) sputter deposition is a recently developed method of PVD which provides uniform barrier layer bottom and sidewall coverage in small contacts. IMP sputter deposition of titanium nitride barrier layers is disclosed in U.S. application Ser. No. 08/511,825 U.S. Pat. No. 5,962,923 of Xu et al., assigned to the assignee of the present invention.

In particular, "IMP" sputtering refers to deposition sputtering, where sputtered target material is passed through an ionization means, such as an inductively coupled RF source, to create a high density, inductively coupled RF plasma between the sputtering cathode (target) and the substrate support electrode. This ensures that a higher portion of the sputtered emission is in the form of ions at the time it reaches the substrate surface. Although not required, the substrate toward which the sputtered ions are moving is typically biased to attract the incoming ions.

IMP sputter-deposited titanium nitride films having low stress and providing high bottom coverage in high aspect ratio features are disclosed in U.S. application Ser. No. 09/003,014, filed Jan. 5, 1998. Although IMP sputter-deposited titanium nitride provides excellent bottom coverage for small contacts, as contact size decreases, increasingly rigorous process conditions (for example, higher process temperatures) are needed, which may cause the titanium nitride layer to fail as a barrier layer. One method of improving the effectiveness of the titanium nitride barrier layer is by oxygen stuffing. The presence of the oxygen atoms in the titanium nitride matrix disrupts channel formation through which mobile silicon atoms at the bottom of the contact can travel.

While oxygen stuffing of sputter-deposited titanium nitride films does prevent the migration of silicon upward from the bottom of the contact, it also introduces additional problems: the oxygen can migrate through the thin titanium nitride barrier layer to the titanium wetting layer on the sidewalls of the contact via, contaminating the titanium wetting layer and forming a layer of titanium oxide which can interfere with the filling of the contact via. Additionally, during filling of the contact, the oxygen can react with the aluminum fill as it flows over the barrier layer surface, resulting in the formation of an undesirable layer of aluminum oxide on the interior surface of the contact via. Aluminum oxide at the bottom of the contact layer increases contact resistivity and aluminum oxide on the sidewalls of the contact via prevents aluminum from flowing easily over the surface of the sidewalls and can cause void formation within the contact.

Therefore, a method of depositing an effective oxygen-containing barrier layer at the bottom of a contact to prevent spiking, while minimizing the oxygen content on the contact via sidewalls to permit complete filling of very small contacts, would be highly advantageous.

SUMMARY OF THE INVENTION

Applicants have discovered that depositing the various film layers of a barrier layer structure in a particular order using a combination of IMP sputter deposition and traditional sputter deposition with specific process conditions produces a barrier layer structure having minimum sidewall oxygen content, which provides excellent barrier properties and allows metal/conductor filling of very small feature sizes while preventing spiking.

It is an object of this invention to provide a barrier layer structure which provides excellent barrier properties in order to prevent junction spiking.

It is an object of this invention to provide a barrier metal wetting layer surface having minimum oxygen content.

It is a further object of this invention to provide a method to achieve complete, void-free metal/semiconductor filling of very small (0.25 micron and smaller) features such as contact vias.

Accordingly, disclosed herein is a barrier layer structure deposited on a substrate. The structure comprises the following layers, deposited from bottom to top:

(a) a first layer of a barrier metal (M), wherein the first layer of barrier metal is deposited by IMP sputter deposition;

(b) a second layer of an oxygen-stuffed barrier metal (MOx), an oxygen-stuffed nitride of a barrier metal (MNOx), or a combination thereof;

(c) a third layer of a nitride of a barrier metal ($MN_x$), wherein the third layer of barrier metal nitride is deposited by IMP sputter deposition of the barrier metal in the presence of nitrogen; and (d) a fourth, wetting layer of a barrier metal, wherein the wetting layer of barrier metal is deposited by traditional sputter deposition or by IMP sputter deposition.

The barrier metal is preferably selected from the group consisting of titanium, tantalum, and tungsten, and is most preferably titanium.

Power to an RF coil used for IMP sputter deposition of the first layer of barrier metal preferably ranges from about 500

W to about 3500 W. The second layer of oxygen-stuffed barrier metal and/or oxygen-stuffed barrier metal nitride is preferably deposited by traditional sputter deposition (i.e., diode sputtering where the power to the target provides the power to support the plasma used to sputter the target, and no specialized energy source, such as an internal inductively coupled coil (for purposes of additional ion generation) or external microwave energy source, need be provided to support the standard source of plasma generation), and DC target power used during deposition of the second layer preferably ranges from about 100 W to about 4000 W. Power to an RF coil used for IMP sputter deposition of the third layer of barrier metal nitride preferably ranges from about 500 W to about 3500 W. The fourth, wetting layer of barrier metal is preferably deposited by traditional (i.e., diode) sputter deposition, and DC target power used during deposition of the fourth layer preferably ranges from about 500 W to about 7500 W.

The barrier layer structure preferably further comprises an additional layer of barrier metal deposited between the second layer of oxygen-stuffed barrier metal and the third layer of barrier metal nitride. The additional layer of barrier metal is preferably deposited by traditional sputter deposition, and DC target power used during deposition of the additional layer of barrier metal preferably ranges from about 500 W to about 7500 W.

The substrate at the bottom of a feature such as a contact via preferably comprises silicon, and the first layer of barrier metal (which is preferably titanium) is preferably deposited directly on the silicon and annealed to form a silicide of the barrier metal ($MSi_2$), Also disclosed herein is a method of depositing a barrier layer structure on a substrate. The method comprises:

(a) depositing a first layer of a barrier metal (M) on the substrate by IMP sputter deposition;

(b) depositing a second layer of an oxygen-stuffed barrier metal (MOx), an oxygen-stuffed nitride of a barrier metal (MNOx), or a combination thereof, (c) depositing a third layer of a nitride of a barrier metal ($MN_x$) by IMP sputter deposition of the barrier metal in the presence of nitrogen; and (d) depositing a fourth, wetting layer of a barrier metal by traditional sputter deposition or by IMP sputter deposition.

The barrier metal is preferably selected from the group consisting of titanium, tantalum, and tungsten, and is most preferably titanium.

Power to an RF coil used for IMP sputter deposition of the first layer of barrier metal preferably ranges from about 500 W to about 3500 W. The second layer of oxygen-stuffed barrier metal and/or oxygen-stuffed barrier metal nitride is preferably deposited by traditional (i.e., diode) sputter deposition, and DC target power used during deposition of the second layer preferably ranges from about 100 W to about 4000 W. Power to an RF coil used for IMP sputter deposition of the third layer of barrier metal nitride preferably ranges from about 500 W to about 3500 W The fourth, wetting layer of barrier metal is preferably deposited by traditional (i e., diode) sputter deposition, and DC target power used during deposition of the fourth layer preferably ranges from about 500 W to about 7500 W.

The method preferably further comprises the step of depositing an additional layer of barrier metal between the second layer of oxygen-stuffed barrier metal and the third layer of barrier metal nitride. Tile additional layer of barrier metal is preferably deposited by traditional (i.e., diode) sputter deposition, and DC target power used during deposition of the additional layer of barrier metal preferably ranges from about 500 W to about 7500 W.

At least a portion of the substrate preferably comprises silicon, and the first layer of barrier metal (which is preferably titanium) is preferably deposited directly on the silicon and annealed to form a silicide of the barrier metal ($MSi_2$). The method preferably further comprises the step of wet-etching the substrate to remove residual unreacted barrier metal from surfaces adjacent the silicon surface after annealing the first layer of barrier metal.

Optionally, if the first barrier metal layer is sufficiently silicided, the second layer of oxygen-stuffed barrier metal can be formed by depositing a layer of a barrier metal, a barrier metal nitride, or a combination thereof, and then treating the deposited barrier metal layer and/or barrier metal nitride layer with oxygen.

Preferably, the method comprises the additional step of depositing a thin layer of metal/conductor on the walls of the contact via using "long throw" sputter deposition (i.e., where the distance between the target and the substrate is equal to or greater than the diameter of the substrate) prior to filling the via with metal/conductor.

DETAILED DESCRIPTION OF THE INVENTION

The present invention pertains to a barrier layer structure which is deposited on a substrate (for example, a silicon wafer) in order to prevent junction spiking in small contacts. In particular, applicants have discovered that depositing various film layers in a particular order using a combination of IMP (i.e., high density plasma sputtering, typically using a secondary energy source for ion generation within the process chamber) and traditional sputter deposition techniques and different process conditions for specific layers results in a barrier layer structure which provides excellent barrier properties while permitting metal/conductor filling of feature sizes of 0.5 micron and smaller without spiking.

I. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF glow discharge, and reference to "the contact material" includes aluminum, aluminum alloys, and other conductive materials which have a melting point enabling them to be sputtered over the temperature range described herein.

Specific terminology of particular importance to the description of the present invention is defined below.

The term "aluminum" includes alloys of aluminum of the kind typically used in the semiconductor industry. Such alloys include aluminum-copper alloys, and II aluminum-copper-silicon alloys, for example.

The term "aspect ratio" refers to the ratio of the height dimension to the width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

The term "barrier metal" refers to any metal which is effective as a barrier to prevent interdiffusion of silicon atoms and metal/conductor atoms.

The term "bottom coverage" refers to the ratio of the thickness of the film layer deposited at the bottom of an interconnect feature, such as a contact via, to the thickness of the film layer deposited on the field surface, expressed as a percentage. For example, if the layer of film deposited at the bottom of a contact via has a thickness of 1 $\mu$m, and the layer of film deposited on the field surface has a thickness of 10 $\mu$m, the bottom coverage of the film would be 10%.

The term "completely filled" refers to the characteristic of a feature, such as a trench or via, which is filled with a conductive material, wherein there is essentially no void space present within the portion of the feature filled with conductive material.

The term "feature" refers to contacts, vias, trenches, and other structures which make up the topography of the substrate surface. As used herein, the term "small feature" refers to a feature having a width dimension (i.e., diameter) of less than 0.5 $\mu$m.

The terms "gamma sputter deposition" and "long throw sputter deposition" refer to a sputter deposition technique which utilizes conventional, non-collimated magnetron sputtering at low pressures, where the distance between the target and the substrate is equal to or greater than the diameter of the substrate. Gamma/long throw sputter deposition enables control of the degree of directionality in the deposition of film layers, resulting in the deposition of thin, conformal coatings on sidewalls of a trench.

The term "Ion Metal Plasma" ("IMP") or "ion sputtering deposition" refers to sputter deposition, preferably magnetron sputter deposition (where a magnet array is placed behind the target), where a high density, inductively coupled RF plasma is positioned between the sputtering cathode and the substrate support electrode, whereby at least a portion of the sputtered emission is in the form of ions at the time it reaches the substrate surface. In ion deposition sputtering, the percentage of target material which is ionized ranges from 10% up to about 90%.

The term "titanium nitride" refers to a compound comprising titanium and nitrogen and having the general formula TiN$_x$, wherein x ranges from about 0.8 to about 1.5.

The term "traditional sputtering" refers to a method of forming a film layer on a substrate wherein a target is sputtered and the material sputtered from the target passes between the target and the substrate to form a film layer on the substrate, and no secondary means is provided to ionize a substantial portion of the target material sputtered from the target before it reaches the substrate. The power to maintain the plasma and thus provide the ions to sputter the target is provided, for example, through the target, which is negatively biased DC, or obtains a negative self-bias when AC powered. One apparatus configured to provide traditional sputtering is disclosed in U.S. Pat. No. 5,320,728, the disclosure of which is incorporated herein by reference. In such a traditional sputtering configuration, the percentage of target material which is ionized is less than 10%, more typically less than 1%, of that sputtered from the target.

II. An Apparatus for Practicing the Invention

A process system in which the method of the present invention may be carried II out is the Applied Materials, Inc. (Santa Clara, Calif.) Endura® Integrated Processing System. The system is shown and described in U.S. Pat. Nos. 5,186,718 and 5,236,868, the disclosures of which are hereby incorporated by reference herein in their entireties.

The traditional sputtering process is well known in the art. An example of an IMP sputtering method is provided by S. M. Rossnagel and J. Hopwood in their papers "Metal ion deposition from ionized magnetron sputtering discharge", *J. Vac. Sci. Technol. B*, Vol. 12, No. 1 (January/February 1994) and "Thin, high atomic weight refractory film deposition for diffusion barrier, adhesion layer, and seed layer applications", *J. Vac. Sci. Technol. B*, Vol. 14, No. 3 (May/June 1996).

III. The Structure of the Barrier Layer

The barrier layer structure of the present invention is deposited in the following order, from bottom to top, on a substrate (for example, a silicon wafer having a patterned layer of silicon dioxide overlying the silicon surface):

(a) a first layer of a barrier metal (M), wherein the first layer of barrier metal is deposited by IMP sputter deposition;

(b) a second layer of an oxygen-stuffed barrier metal (MOx) and/or an oxygen-stuffed nitride of a barrier metal (MNOx);

(c) a third layer of a nitride of a barrier metal (MN$_x$), wherein the third layer of barrier metal nitride is deposited by IMP sputter deposition of the barrier metal in the presence of nitrogen; and (d) a fourth, wetting layer of a barrier metal, wherein the wetting layer of barrier metal is deposited by traditional sputter deposition or by IMP sputter deposition.

The barrier metal is preferably selected from the group consisting of titanium, tantalum, and tungsten, and is most preferably titanium. When the contact via is to be filled with aluminum, the barrier metal is preferably titanium; when the contact via is to be filled with copper, the barrier metal is preferably tantalum. Other, less preferred barrier metals which may be used in the barrier layer structure of the invention include zirconium, vanadium, chromium, molybdenum, niobium, or hafnium.

The preferred embodiments of the barrier layer structure of the invention are discussed below with respect to titanium as the barrier metal.

Figure 1:
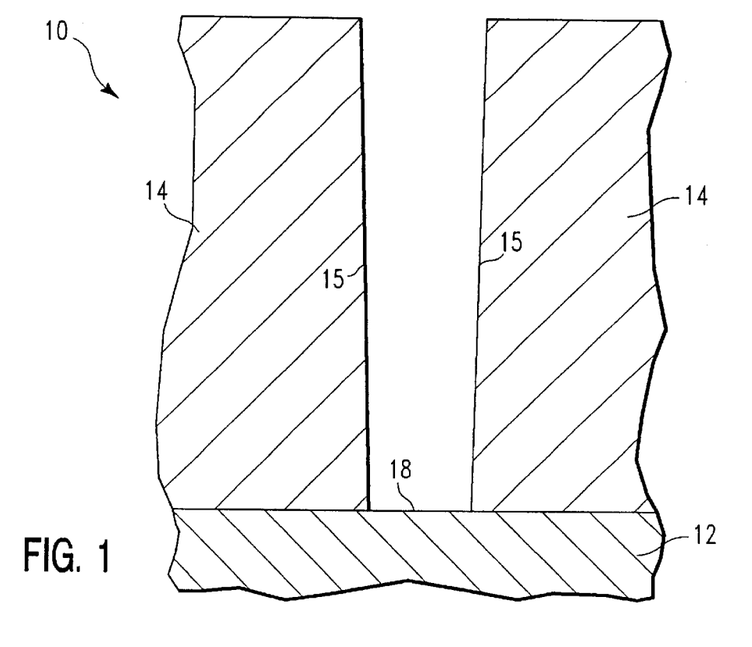
FIG. 1 shows a generic contact via prior to deposition of the barrier layer structure of the invention.

FIG. 1 shows a generic contact/via 10 prior to deposition of a barrier layer structure of the invention. Shown in the drawing are a silicon (Si) substrate 12 at the bottom of the contact via and silicon dioxide ($SiO_2$) 14 along the sidewalls 15 of the contact via 10. The purpose of the barrier layer structure of the invention is to prevent silicon atoms from substrate 2 from migrating up through the, bottom 18 of the contact via 10, where it could potentially react with an aluminum fill (not shown).

Figure 2:
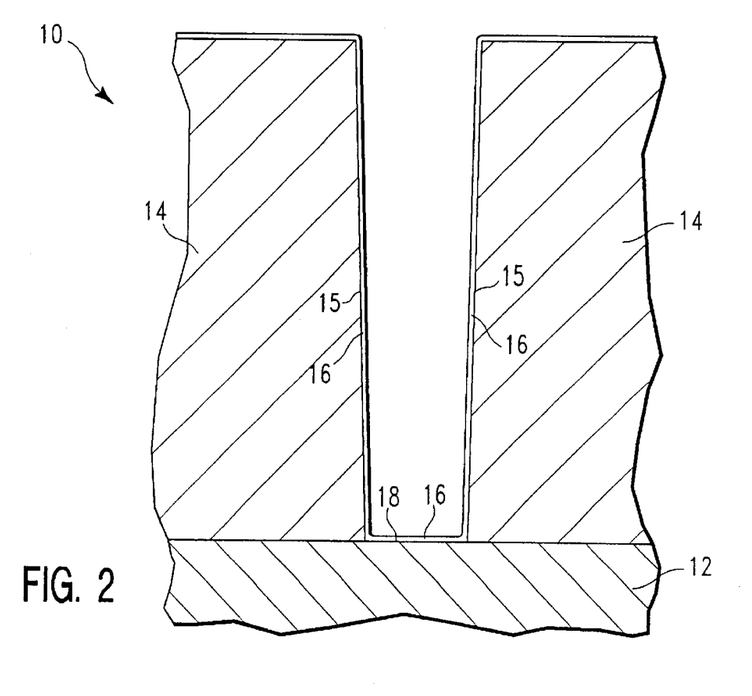
FIG. 2 shows the contact via of FIG. 1 following IMP sputter deposition of the first layer of titanium.

FIG. 2 shows the contact via of FIG. 1 following IMP sputter deposition of the first layer 16 of titanium, The thickness of the first layer 16 of titanium is preferably within the range of about 20–300 Å in thickness; more preferably, between about 100–200 Å, most preferably, about 200 Å. (Note: The relative thicknesses of the film layers illustrated in FIGS. 2–7 are not to scale. The drawings are intended only to show the order in which the various film layers are deposited on the substrate material.) The first layer 16 of titanium is deposited in order to reduce contact resistance between the silicon substrate 12 and the subsequent aluminum fill (not shown). The buffer zone also shields the silicon substrate 12 from reacting with the oxygen in the oxygen-stuffed titanium layer. If the mobile silicon atoms from the silicon substrate 12 are allowed to react with oxygen, silicon dioxide will be formed, which will increase the resistance of the contact. For example, we have observed a 30% decrease in electrical transfer of the device if the first layer of titanium is omitted and oxygen-stuffed titanium is used as the first layer in a barrier layer structure.

Optionally, the first layer 16 of titanium is annealed to form titanium silicide ($TiSi_2$). Every angstrom of Ti will form 2–2.5 angstroms of $TiSi_2$. For example, a layer of Ti having a thickness of 100 Å will, after reaction with silicon, form 200–250 Å of $TiSi_2$. This reaction forms a layer in the bottom/interface of the contact and eliminates the increase in surface area which may be exposed when a contact via is overetched isotropically. This in turn reduces Si/Al interdiffusion, thus reducing contact resistance and the possibility of junction spiking which may result from overetching of contacts.

Figure 3:
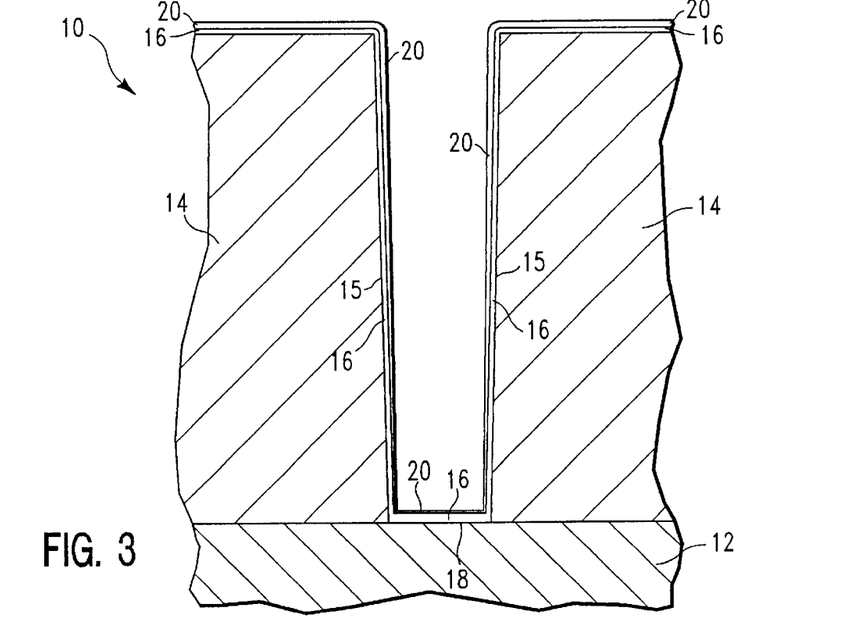
FIG. 3 shows the contact via of FIG. 2 following deposition of the second layer of oxygen-stuffed titanium and/or titanium nitride.

FIG. 3 shows the contact via of FIG. 2 following traditional sputter deposition of a second layer 20 of oxygen-stuffed titanium and/or titanium nitride, The second layer 20 of oxygen-stuffed titanium/titanium nitride preferably has a thickness of about 10–200 Å, most preferably, about 30–60 Å, and is provided in order to improve the effectiveness of the titanium and/or titanium nitride as a barrier layer. The presence of oxygen in the titanium matrix disrupts the formation of channels through which mobile silicon atoms can travel.

Figure 4:
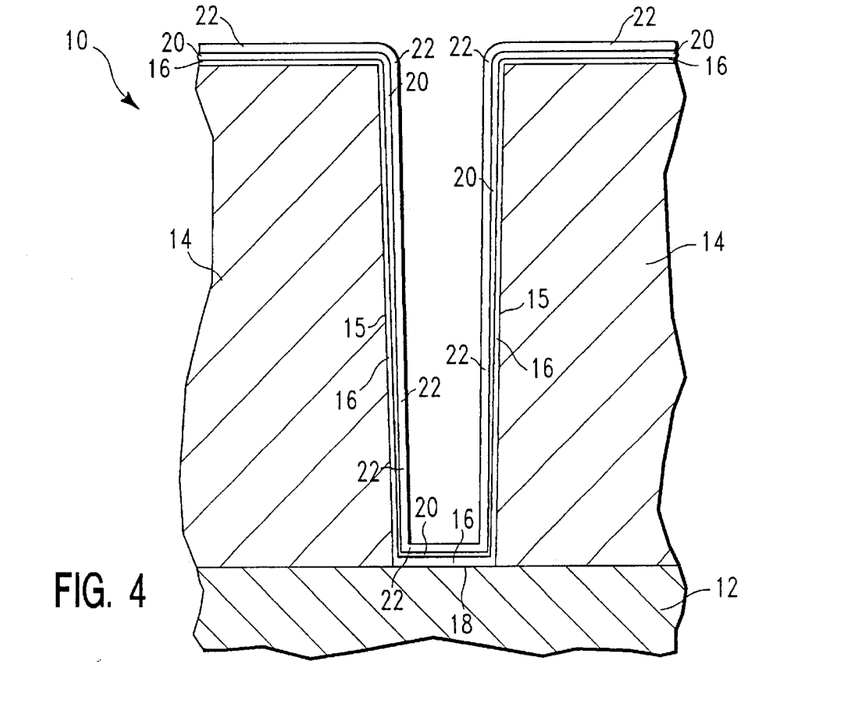
FIG. 4 shows the contact via of FIG. 3 following traditional sputter deposition of the optional layer of titanium.

FIG. 4 shows the contact via of FIG. 3 following traditional sputter deposition of the optional layer 22 of titanium. The optional layer 22 of titanium preferably has a thickness of about 0–350 Å, most preferably, about 150 Å. The purpose of the optional titanium layer 22 is to further reduce the possibility of oxygen moving toward the upper surface of the barrier layer structure.

Figure 5:
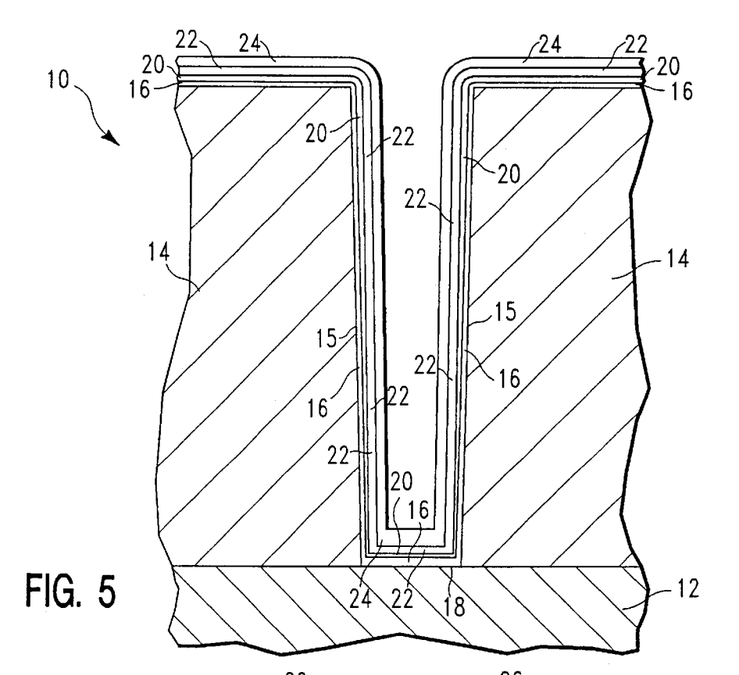
FIG. 5 shows the contact via of FIG. 4 following IMP sputter deposition of the third layer of titanium nitride.

FIG. 5 shows the contact via of FIG. 4 following IMP sputter deposition of the third layer 24 of titanium nitride The thickness of the titanium nitride layer is preferably about 200–1200 Å; more preferably, about 200–1000 Å; most preferably, about 800 Å. The third layer of titanium nitride is deposited as the main barrier layer to prevent the migration of silicon to the top of the barrier structure, where it could react with aluminum during filling of the contact.

Figure 6:
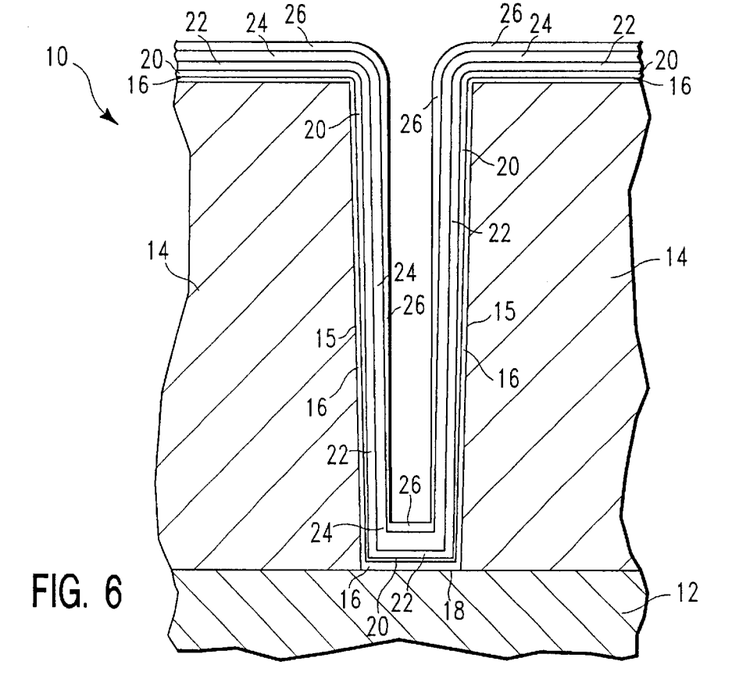
FIG. 6 shows the contact via of FIG. 5 following traditional sputter deposition of the fourth, wetting layer of titanium.

FIG. 6 shows the contact via of FIG. 5 following traditional sputter deposition of the fourth, wetting layer 26 of titanium, The thickness of the wetting layer 26 is preferably about 0–500 Å, most preferably, about 300 Å. The fourth, wetting layer 26 of titanium is deposited for the purpose of inducing the flow of aluminum over the surface of the feature to provide complete fill of the feature with aluminum.

Figure 7:
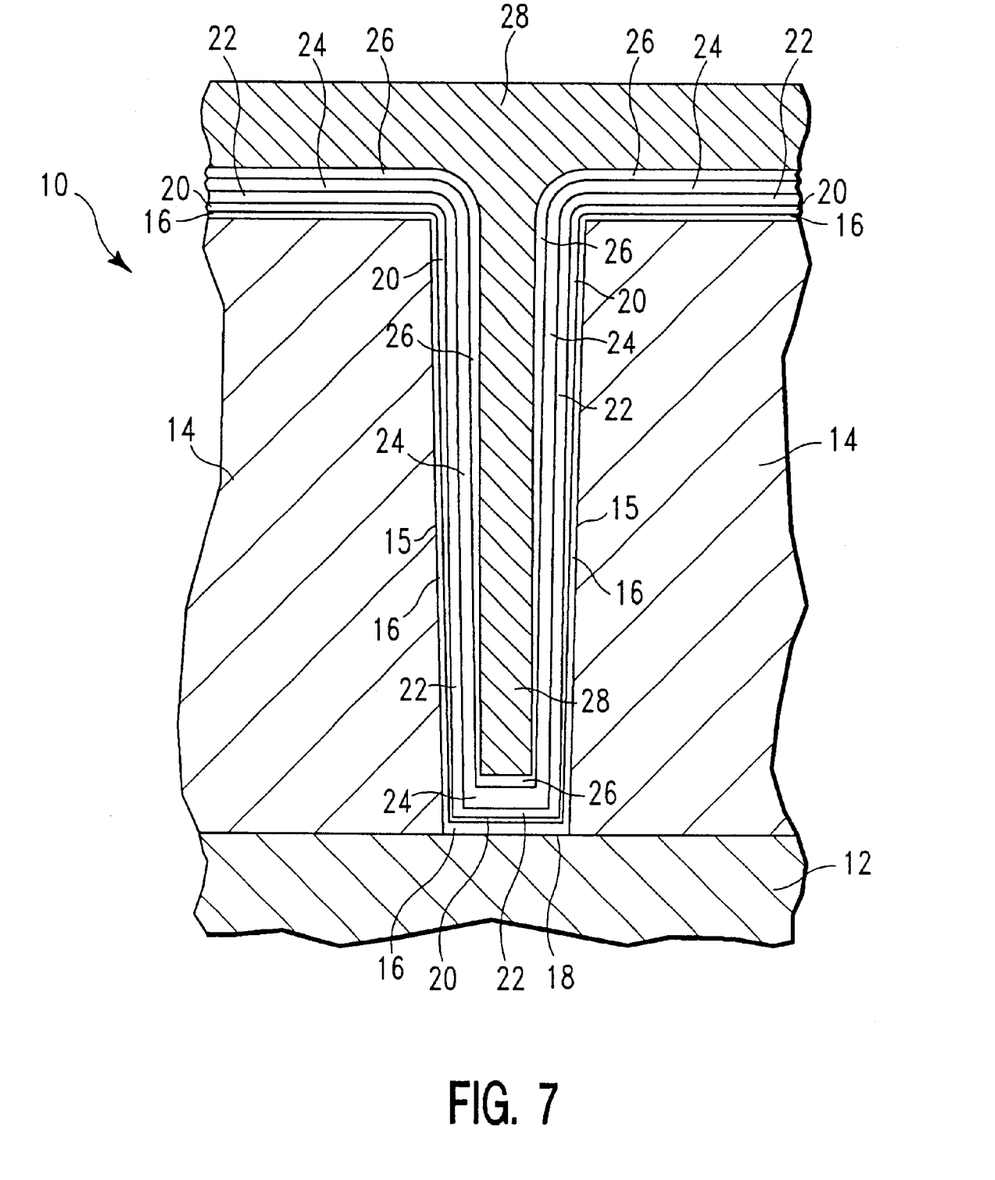
FIG. 7 shows the contact via of FIG. 6 following aluminum filling of the contact via.

FIG. 7 shows the contact via 10 of FIG. 6 following filling of the contact via with aluminum 28.

Figure 8A:
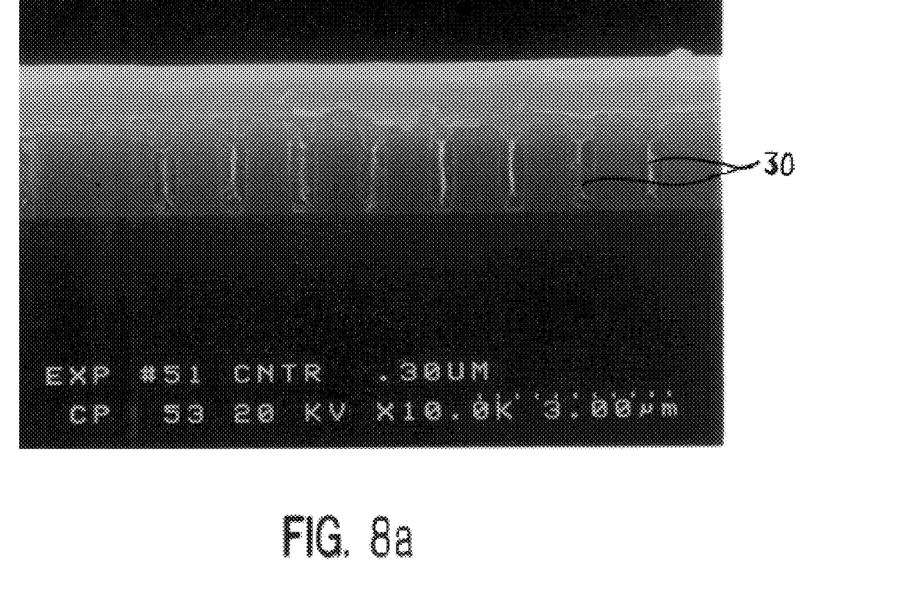
FIGS. 8a and 8b show contact vias having a feature size of 0.30 μm after aluminum planarization following deposition of the following barrier layer structure (from bottom layer to top layer): 200 Å thick titanium layer; oxygen-stuffed titanium (TiOx) layer; 150 Å thick titanium wetting layer; 800 Å thick titanium nitride layer; and 300 Å thick titanium wetting layer.
Figure 8B:
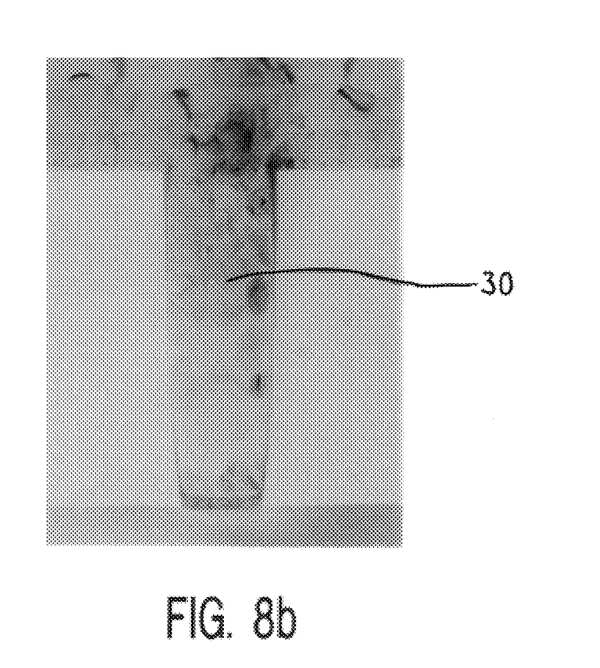

FIG. 8a shows contact vias 30 having a feature size of 0.30 μm after aluminum planarization following deposition of the following barrier layer structure (from bottom to top): 200 Å thick titanium layer; oxygen-stuffed titanium (TiOx) layer; 150 Å thick titanium wetting layer; 800 Å thick titanium nitride layer; and 300 Å thick titanium wetting layer. FIG. 8b shows an enlarged view of a 0.30 μm contact via 30.

IV. The Method of Depositing a Barrier Layer Structure on a Substrate

The method of the present invention comprises depositing a barrier layer structure on a substrate (for example, a silicon wafer) in the following order:

(a) depositing a first layer of a barrier metal (M) on the substrate by IMP sputter deposition;

(b) depositing a second layer of an oxygen-stuffed barrier metal (MOx) and/or an oxygen-stuffed nitride of a barrier metal (MNOx);

(c) depositing a third layer of a nitride a barrier metal ($MN_x$) by IMP sputter deposition of the barrier metal in the presence of nitrogen; and (d) depositing a fourth, wetting layer of a barrier metal by traditional sputter deposition or by IMP sputter deposition.

The barrier metal is preferably selected from the group consisting of titanium, tantalum, and tungsten, and is most preferably titanium. When the contact via is to be filled with aluminum, the barrier metal is preferably titanium; when the contact via is to be filled with copper, the barrier metal is preferably tantalum. Other, less preferred barrier metals which may be used in the method of the invention include zirconium, vanadium, chromium, molybdenum, niobium, or hafnium.

The preferred embodiments of the method of the invention are discussed below with respect to titanium as the barrier metal.

A first layer of titanium is deposited on the substrate surface by IMP sputter deposition with high density plasma, preferably with high wafer bias, so that the first titanium layer is mostly deposited at the bottom of the contact via, rather than on the sidewalls, It is especially important to use high wafer bias (i.e., at least about −30 V) with small feature size (i.e., less than 0.5 μm) contact vias. By maintaining a high wafer bias, the trajectories of the ionized target atoms can be modified to be substantially perpendicular to the wafer, and thus in line with the depth direction of the contact/via structure, which enables many of the ionized atoms to reach the bottom of the contact/via structure. The general method of depositing this titanium layer is best described in U.S. application Ser. No. 08/511,825, of Xu et al., previously referenced herein.

In this particular instance, chamber pressure and wafer bias are used to control contact/via sidewall coverage. High wafer bias is used to reduce the amount of Ti deposited on the sidewall and a limited increase in process chamber pressure may be used to increase the bottom coverage in a feature such as a contact/via. Reducing the sidewall Ti layer thickness also reduces the amount of TiOx that is formed on the sidewall when oxygen is introduced into the chamber in subsequent process steps. Any oxygen on the sidewall may diffuse through the third layer of Ti/TiN and contaminate the fourth layer upper surface Ti wetting layer, which causes deposition difficulties when the aluminum is deposited on the wetting layer surface.

Optionally, the first layer of titanium can be annealed to form titanium silicide ($TiSi_2$). Annealing is accomplished by beating the titanium to a temperature within the range of about 600° C. to about 900° C. for a period of about 30 seconds to about 60 seconds. The wafer typically must be removed from the processing chamber in order to perform this step. The alternative methods of the present invention make this annealing step unnecessary in some instances.

If annealing is carried out, the wafer is preferably wet-etched thereafter, using a selective solution to remove any residual unreacted Ti on the sidewalls (i.e., Ti that has not reacted to form $TiSi_2$). The wafer may be wet-etched, for example, by immersing the wafer in a wet etch solution of $H_2O_2:NH_4OH:H_2O$ (1:1:3) for about 50–180 seconds. Excess Ti is removed so it will not be present to react with the subsequent oxygen that is released into the chamber during the deposition of the oxygen-stuffed layer.

A second layer of oxygen-stuffed titanium and/or oxygen-stuffed titanium nitride is deposited next. The oxygen-stuffed layer may be deposited by traditional sputter deposition or by IMP sputter deposition, but is preferably deposited by traditional sputter deposition, the procedure for which is well-known in the art. Although IMP sputter deposition increases the ionization of TiOX and thus directs it to the bottom of the contact via, IMP sputter deposition is less preferred for use in this step, because the oxygen can react with the RF coil itself (where the coil is internal to the chamber) and can damage the processing equipment. Additionally, providing power to the RF coil increases the process chamber temperature, which can increase the rate of reaction of the oxygen with the coil. Thus, the second layer deposition step is preferably performed in a chamber which does not include a coil internal to the chamber, such as a traditional diode sputtering apparatus, or an apparatus having the high density plasma-generating means external to or isolated from the processing environment.

To form TiOx, oxygen is preferably introduced into the chamber while a small amount of Ti is deposited. The oxygen reacts with the titanium, resulting in an oxygen-stuffed layer. If oxygen-stuffed titanium nitride is desired, nitrogen flow to the processing chamber is also started at this time. The atomic % oxygen in the oxygen-stuffed layer is typically within the range of between about 20% to about 50%. A reference for oxygen stuffing can be found in the Proceedings of VMIC 96, p. 584.

In an alternative, less preferred embodiment of step (b), a layer of titanium or titanium nitride may be deposited, then treated with oxygen post-deposition to form the oxygen-stuffed titanium/titanium layer. This alternative oxygen-stuffing process may be used when the first titanium layer is sufficiently silicided, has a sufficient thickness, or is otherwise protected to prevent the oxygen from reaching the underlying silicon substrate. However, this process is less preferred because it is more difficult to control the amount of oxygen which is delivered to the titanium/titanium nitride layer than when the titanium/titanium nitride and oxygen are sputtered simultaneously.

Optionally, an additional layer of titanium can be deposited by traditional sputter deposition after deposition of the oxygen-stuffed layer, A third layer of titanium nitride is then deposited by IMP sputter deposition of titanium in the presence of nitrogen IMP sputter deposition is used in this step in order to reduce the overhang of the deposited film layers at the top of the contact and to obtain a relatively thick barrier layer of titanium nitride at the bottom of the contact.

Preferably, the titanium layers and titanium nitride layer are deposited in separate processing chambers of a multi-chamber processing apparatus (where no breaking of the vacuum occurs). However, if the same processing chamber is used for deposition of the titanium and titanium nitride layers, it is often necessary to sputter the chamber with plasma to remove residual titanium nitride from off of the chamber surfaces and to cover the chamber with clean titanium prior to deposition of the titanium wetting layer. Sputtering of the chamber with plasma is often performed in the presence of a 'dummy' (i.e., unpatterned) silicon wafer. During the sputtering/cleaning process, residual titanium nitride will be sputtered off the target, depositing the residual titanium nitride on the dummy wafer. This cleaning step may be required in order to keep the titanium wetting layer from being contaminated with residual titanium nitride, which could interfere with subsequent fill of the contact via.

A fourth layer of titanium is then deposited as a wetting layer, preferably by traditional sputter deposition (although IMP sputtering may be used).

Filling of the contact via with a metal/conductor (for example, aluminum or copper) is then performed. Preferably, a thin layer of metal/conductor is first deposited on the walls of the contact via by "long throw" (also known as "gamma") sputter deposition prior to filling the via with metal/conductor in order to provide more uniform fill. Long throw sputtering enables control of the degree of directionality in the deposition of film layers, resulting in the deposition of thin, conformal coatings on sidewalls of a trench.

The technique for long throw sputtering is described by S. M. Rossnagel and J. Hopwood in their paper entitled "Thin, high atomic weight refractory film deposition for diffusion barrier, adhesion layer, and seed layer applications", *J. Vac. Sci. Technol.*, B 14(3), May/June 1996. The method uses conventional, non-collimated magnetron sputtering at low pressures, with improved directionality of the depositing atoms. The improved directionality is achieved by increasing the distance between the workpiece surface (the throw), such that the distance between the target and the substrate is equal to or greater than the diameter of the substrate, and by reducing the argon pressure during sputtering. For a film deposited with commercial cathodes (Applied Materials Endura® class; circular planar cathode with a diameter of 30 cm) and rotating magnet defined erosion paths, a throw distance of 25 cm is said to be approximately equal to an interposed collimator of aspect ratio near 1.0, to enable the aluminum to reach the bottom and sidewalls of the contact via structure without causing a bridge-over effect of the structure experienced in some sputter deposition configurations. In the present disclosure, use of this long throw technique with traditional, non-collimated magnetron sputtering at low pressures is sometimes referred to as "gamma sputtering" or "gamma sputter deposition".

Table 1 shows preferred, more preferred, and optimum process conditions for sputter deposition of the various layers of the barrier layer structure according to the method of the invention, as well as for aluminum filling following deposition of the barrier layer structure of the invention.

TABLE 1

Process Condition for Sputter Deposition of Barrier Layer Structure

| Layer | Preferred Process Conditions | More Preferred Process Conditions | Optimum Process Conditions |
|---|---|---|---|
| IMP Ti | | | |
| Thickness* (Å) | 20–300 | 100–200 | 200 |
| Temperature (° C.) | 18–600 | 100–200 | 200 |
| Pressure (mT) | 10–70 | 25–45 | 41 |
| Gas Flow (sccm) | ArH** 15/Ar 85 | | |
| DC Target Power (W) | 500–7500 | 4000 | 4000 |
| RF Coil Power (W) | 500–3500 | 2500 | 2500 |
| AC Wafer Bias (W) | 0–500 | 0–450 | 450 |
| AC Wafer Bias (−V) | 0–250 | 0–120 | 40–70 |
| TiOx | | | |
| Thickness (Å) | 10–200 | 30–60 | 30–60 |
| Temperature (° C.) | 18–600 | 100–200 | 200 |
| Pressure (mT) | 2–70 | 2–70 | 4 |
| Gas Flow (sccm) | Ar 5/$O_2$ 15 | | |
| DC Target Power (W) | 100–4000 | 500 | 500 |
| RF Coil Power (W) | 0–3500 | 0–1500 | 0 |
| AC Wafer Bias (W) | 0–500 | 0 | 0 |
| AC Wafer Bias (−V) | 20–250 | 20 | 20 |
| Ti (optional) | | | |
| Thickness (Å) | 0–350 | 0–350 | 150 |
| Temperature (° C.) | 18–600 | 100–200 | 200 |
| Pressure (mT) | 2–70 | 10–45 | 10 |
| Gas Flow (sccm) | ArH 15/Ar 5 | | |
| DC Target Power (W) | 500–7500 | 4000 | 4000 |
| RF Coil Power (W) | 0–3500 | 1500–2500 | 1500 |
| AC Wafer Bias (W) | 0–500 | 0–350 | 0 |
| AC Wafer Bias (−V) | 0–250 | 2–90 | 0–3 |

*Thickness of the film layer at the field surface as measured by transmission electron microscopy (TEM) using a CM200 transmission electron microscope, manufactured by Phillips Labs.
**ArH is the Ar gas flow rate from the heater.

| Layer | Preferred Process Conditions | More Preferred Process Conditions | Optimum Process Conditions |
|---|---|---|---|
| IMP TiN | | | |
| Thickness* (Å) | 150–1200 | 200–1000 | 800 |
| Temperature (° C.) | 18–600 | 100–200 | 200 |
| Pressure (mT) | 5–80 | 10–35 | 33 |
| Gas Flow (sccm) | ArH** 15/Ar 10/$N_2$ 64 | | |
| DC Target Power (W) | 500–7500 | 5000 | 5000 |
| RF Coil Power (W) | 500–3500 | 2500 | 2500 |
| AC Wafer Bias (W) | 0–500 | 20–450 | 450 |
| AC Wafer Bias (−V) | 0–250 | 60–190 | 140–180 |
| Ti | | | |
| Thickness (Å) | 0–500 | 0–500 | 300 |
| Temperature (° C.) | 18–600 | 100–200 | 200 |
| Pressure (mT) | 2–70 | 10–45 | 10 |
| Gas Flow (sccm) | ArH 15/Ar 5 | | |
| DC Target Power (W) | 500–7500 | 4000 | 4000 |
| RF Coil Power (W) | 0–3500 | 500 | 1500 |
| AC Wafer Bias (W) | 0–500 | 0 | 0 |
| AC Wafer Bias (−V) | 0–250 | 2–3 | 2–3 |
| Gamma Al (optional) | | | |
| Thickness (Å) | 1000–1500 | 1500–4000 | 1700 |
| Temperature (° C.) | 18–150 | 18–50 | 18 |
| Pressure (mT) | 0.3–1.0 | 0.3–0.5 | 0.35 |
| Gas Flow (sccm) | 6 | | |
| DC Target Power (W) | 10,000–20,000 | 10,000–15,000 | 12,000 |
| Al | | | |
| Thickness (Å) | 2500–15,000 | 11,500 | 11,500 |
| Temperature (° C.) | 18–600 | 430–520 | 520 |
| Pressure (mT) | 2–70 | 2 | 2 |
| Gas Flow (sccm) | ArH 0–15/Ar 35–50 | | |
| DC Target Power (W) | 500–15,000 | 1000–12,000 | 1000–12,000 |

*Thickness of the film layer at the field surface as measured by transmission electron microscopy (TEM) using a CM200 transmission electron microscope, manufactured by Phillips Labs.
**ArH is the Ar gas flow rate from the heater.

The barrier structure layers identified in Table 1, above, were produced in an Endura® Integrated Processing System available from Applied Materials of Santa Clara, Calif. The physical vapor deposition (i.e., sputtering) process chamber is capable of processing an 8 inch (200 mn) diameter silicon wafer. The substrate was a silicon wafer having a silicon oxide surface coating with contact vias in the surface of the silicon oxide.

The process chamber pressure, DC target power, RF coil power, and wafer substrate bias used for each layer may be adjusted to provide particular sidewall coverages.

V. Testing of Barrier Layer Structures for Prevention of Junction Spiking

Titanium barrier layer structures with and without oxygen-stuffed titanium layers were tested for junction spiking according to the following procedure: The barrier layer structures were deposited on standard silicon wafers containing contact vias having a feature size of 0.30 $\mu$m, followed by aluminum filling of the contact vias. The wafers were heated to 500° C. for approximately 30 minutes.

The wafers were then stripped of metals and processed in a spike decoration solution according to the following procedure. To remove the aluminum layer, the wafers were immersed in a solution comprising 18:1:1$H_2PO_4$:$HNO_3$:$H_2O$ for approximately 10–15 minutes, depending on the thickness of the aluminum layer. Then, to remove the titanium-comprising layers, the wafers were immersed in a solution comprising 1:1$NH_4OH$:$H_2O$ for approximately 10–15 minutes, depending on the combined thickness of the titanium-comprising layers. The wafers were then immersed in a solution comprising 10:1:1$H_2O$:$HNO_3$:$HF$ for approximately 60 seconds. The wafers were then rinsed with deionized water and dried in a spin dryer.

The wafers were then examined using an optical microscope. The small size of the contact vias made it difficult to clearly observe spiking in some cases.

When observation of spiking (or no spiking) was difficult, all layers deposited on the wafers (i.e., metal and oxide) were stripped down to silicon by immersing the wafers in a solution comprising 49% HF in $H_2O$ for approximately 30–120 seconds, depending on the thickness of the silicon dioxide layer. The stripped wafers were then examined for spiking using scanning electron microscopy (SEM).

Figure 9A:
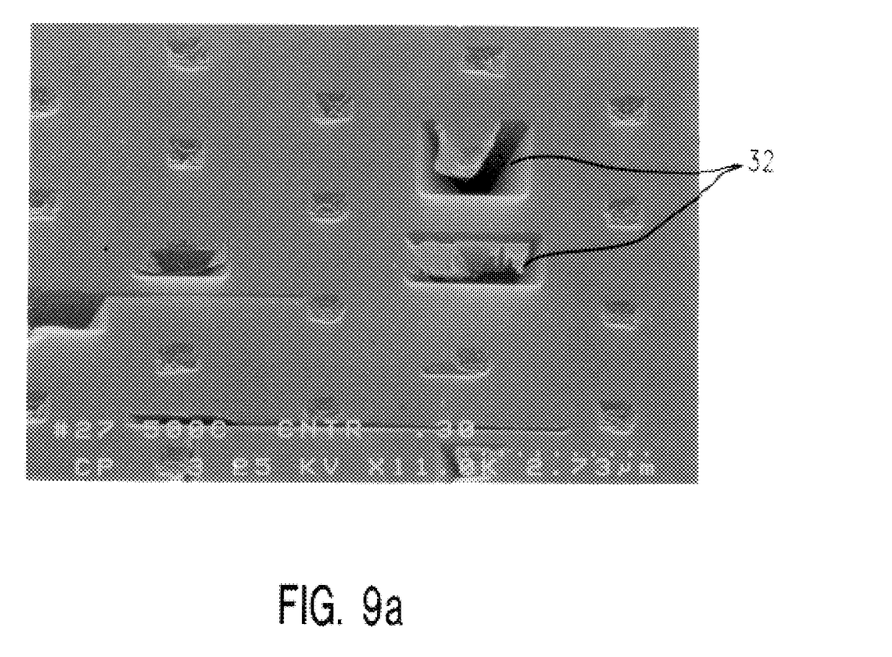
FIG. 9a shows the severe junction spiking which is observed with contact vias having a barrier layer structure which does not include an oxygen-stuffed titanium layer.

FIG. 9a shows the severe junction spiking which is observed with contact vias having a barrier layer structure which does not include an oxygen-stuffed titanium layer.

The barrier layer structure comprised the following layers: 200 Å thick titanium layer; 150 Å thick titanium wetting layer; 800 Å thick titanium nitride layer, and 300 Å thick titanium wetting layer, followed by aluminum platarization. The irregular, squared-off shapes of the contact vias 32 shown in FIG. 9a indicate the occurrence of severe junction spiking. Junction spiking occurs when silicon atoms diffuse from single-crystal silicon into a metal electrode of pure aluminum to such a depth as to short out a shallow p-n junction in the silicon.

Figure 9B:
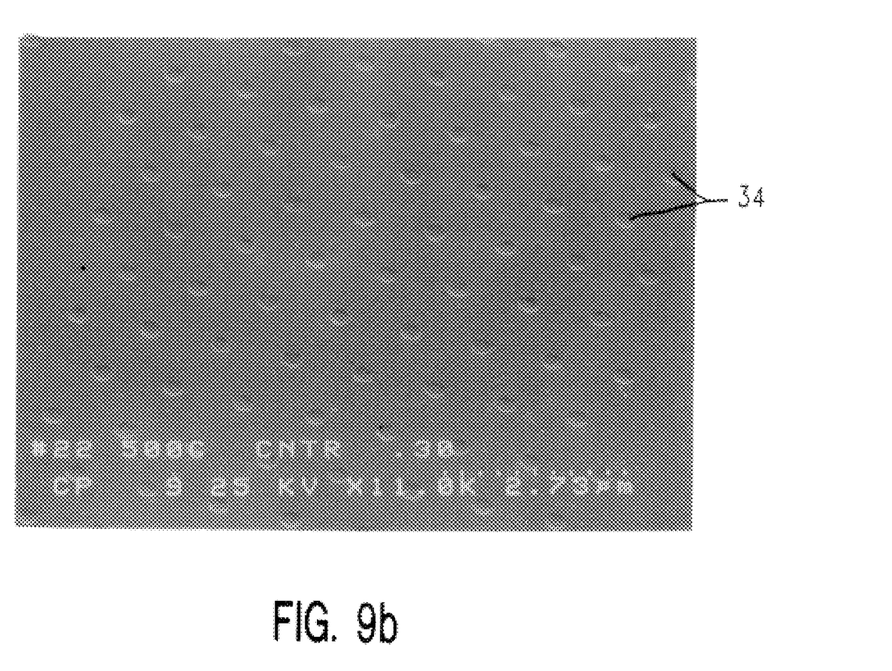
FIG. 9b shows contact vias which were coated with a barrier layer structure of the present invention, which included an oxygen-stuffed titanium layer.

FIG. 9b shows contact vias 34 which were coated with a barrier layer structure of the present invention, which included an oxygen-stuffed titanium layer. The barrier layer structure comprised the following layers; 200 Å thick titanium layer; 150 Å thick titanium wetting layer; 800 Å thick titanium nitride layer; and 300 Å thick titaniumi wetting layer, followed by aluminum planarization. The regular, oval shapes of the contact vias 34 shown in FIG. 9b indicate that junction spiking has not occurred.

Barrier layer structures prepared according to the method of the invention allow for metal/conductor filling of feature sizes down to 0.25 micron and smaller without spiking of aluminum or other conductive metal through the barrier structure during the metal/conductor filling process, or later during use.

The above described preferred embodiments are not intended to limit the scope of the present invention, as one skilled in the art can, in view of the present disclosure, expand such embodiments to correspond with the subject matter of the invention claimed below.

What is claimed is:

1. A barrier layer structure deposited on a substrate, wherein the structure comprises the following layers, deposited from bottom to top:

(a) a first layer of a barrier metal;

(b) a second layer of an oxygen-stuffed barrier metal, an oxygen-stuffed nitride of a barrier metal, or a combination thereof, (c) a third layer of a nonoxygenated nitride of a barrier metal; and (d) a fourth, wetting layer of a barrier metal, wherein said barrier layer structure includes sidewalls extending upward from a base, and wherein said sidewalls contain less oxygen atoms than said base.

2. The barrier layer structure of claim 1, wherein said barrier metal is selected from the group consisting of titanium, tantalum, and tungsten.

3. The barrier layer structure of claim 2, wherein said barrier metal is titanium.

4. The barrier layer structure of claim 1, wherein said first layer of barrier metal is deposited by ion sputtering deposition.

5. The barrier layer structure of claim 4, wherein said ion sputtering deposition of said first layer of barrier metal is carried out using an applied power ranging from about 500 W to about 3500 W.

6. The barrier layer structure of claim 1, wherein said second layer of oxygen-stuffed barrier metal or oxygen-stuffed barrier metal nitride, or combination thereof is deposited by traditional sputter deposition.

7. The barrier layer structure of claim 1, wherein said third layer of barrier metal nitride is deposited by ion sputtering deposition of said barrier metal in the presence of nitrogen.

8. The barrier layer structure of claim 7, wherein said ion sputtering deposition of said third layer of barrier metal nitride is carried out using an applied power ranging from about 500 W to about 3500 W.

9. The barrier layer structure of claim 1, wherein said fourth, wetting layer of barrier metal is deposited by traditional sputter deposition or by ion sputtering deposition.

10. The barrier layer structure of claim 9, wherein said fourth, wetting layer of barrier metal is deposited by traditional sputter deposition, and DC target power used during deposition of said fourth layer ranges from about 500 W to about 7500 W.

11. The barrier layer structure of claim 1, wherein said barrier layer structure further comprises an additional layer of barrier metal deposited between said second layer of oxygen-stuffed barrier metal and said third layer of barrier metal nitride.

12. The barrier layer structure of claim 11, wherein said additional layer of barrier metal is deposited by traditional sputter deposition.

13. The barrier layer structure of claim 1, wherein said substrate comprises silicon, said first barrier metal layer is deposited directly on said silicon, and said barrier metal is annealed to form a silicide of said barrier metal.

14. The barrier layer structure of claim 10, wherein said barrier metal is titanium.

* * * * *